(12) United States Patent
Tamaoka

(10) Patent No.: US 9,431,925 B2
(45) Date of Patent: Aug. 30, 2016

(54) HALF BRIDGE CIRCUIT, FULL BRIDGE CIRCUIT CONSTRUCTED WITH HALF BRIDGE CIRCUIT, AND THREE-PHASE INVERTER CIRCUIT CONSTRUCTED WITH HALF BRIDGE CIRCUIT

(71) Applicant: Panasonic Intellectual Property Management Co., Ltd., Osaka (JP)

(72) Inventor: Shuji Tamaoka, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/800,739

(22) Filed: Jul. 16, 2015

(65) Prior Publication Data

US 2015/0318797 A1    Nov. 5, 2015

Related U.S. Application Data

(63) Continuation of application No. PCT/JP2014/000325, filed on Jan. 23, 2014.

(30) Foreign Application Priority Data

Jan. 24, 2013   (JP) .................................. 2013-010983

(51) Int. Cl.
*H02M 7/5387* (2007.01)
*H03K 17/16* (2006.01)
(Continued)

(52) U.S. Cl.
CPC ............. *H02M 7/5387* (2013.01); *H02M 1/08* (2013.01); *H03K 17/165* (2013.01); *H02M 2001/0058* (2013.01); *Y02B 70/1491* (2013.01)

(58) Field of Classification Search
CPC ............ H02M 2001/0048–2001/0054; H02M 7/5387; H02M 7/5395; H03K 17/161; H03K 17/162; H03K 17/163
See application file for complete search history.

(56) References Cited

U.S. PATENT DOCUMENTS

2009/0201072 A1\* 8/2009 Honea .............. H03K 17/08142
327/424
2011/0026285 A1\* 2/2011 Kawashima ........ H02M 1/4208
363/127

(Continued)

FOREIGN PATENT DOCUMENTS

JP   2011-151905   8/2011
JP   2011-182591   9/2011

(Continued)

OTHER PUBLICATIONS

International Search Report of PCT application No. PCT/JP2014/000325 dated Apr. 28, 2014.

*Primary Examiner* — Jessica Han
(74) *Attorney, Agent, or Firm* — McDermott Will & Emery LLP

(57) ABSTRACT

In a half bridge circuit according to one aspect of the present disclosure, when a voltage between a first terminal and a third terminal or a voltage between the first terminal and the second terminal is greater than or equal to a threshold voltage, a current is passed from the second terminal to the third terminal or from the third terminal to the second terminal according to a polarity of the voltage between the second terminal and the third terminal. When the current is passed from the third terminal to the second terminal, the voltage between the second terminal and the third terminal changes with respect to the voltage applied between the first terminal and the third terminal within a range where the voltage between the first terminal and the third terminal is less than or equal to the threshold voltage.

6 Claims, 11 Drawing Sheets

(51) Int. Cl.
   *H02M 1/08*    (2006.01)
   *H02M 1/00*    (2006.01)

(56) References Cited

U.S. PATENT DOCUMENTS

| | | |
|---|---|---|
| 2011/0215746 A1 | 9/2011 | Ikoshi et al. |
| 2011/0228564 A1 | 9/2011 | Uruno et al. |
| 2012/0075890 A1 | 3/2012 | Ozawa |
| 2012/0127767 A1* | 5/2012 | Spits ............... H03K 19/09407 363/131 |
| 2012/0236615 A1 | 9/2012 | Kitabatake |
| 2014/0091324 A1* | 4/2014 | Zushi .................... H02M 1/08 257/77 |
| 2015/0003133 A1* | 1/2015 | Ogawa ................ H03K 17/168 363/132 |

FOREIGN PATENT DOCUMENTS

| | | |
|---|---|---|
| JP | 2011-193705 | 9/2011 |
| JP | 2012-074829 | 4/2012 |
| WO | 2012/056719 | 5/2012 |

* cited by examiner

FIG. 2B

| Classification | Switch element configuration diagram | Electric characteristic diagram | | |
|---|---|---|---|---|
| | | Output current-output voltage (parameter: control voltage) | Output current-control voltage (output voltage > 0V) | Output voltage-control voltage (output current is fixed to (−) direction) |
| IGBT + FWD | b column | b-1 Ice, Vge>Vth, Vce, -VF, 1.2, 1.Vge=0V 2.Vge=-VB | b-2 Ice, Vce>0, Vth, Vge | b-3 -Ice, Vce, 0, -VF, Vge |

HALF BRIDGE CIRCUIT, FULL BRIDGE CIRCUIT CONSTRUCTED WITH HALF BRIDGE CIRCUIT, AND THREE-PHASE INVERTER CIRCUIT CONSTRUCTED WITH HALF BRIDGE CIRCUIT

BACKGROUND OF THE INVENTION

1. Field of the Invention

The present disclosure relates to a half bridge circuit used in an AC-DC converter or inverter, a full bridge circuit constructed with the half bridge circuit, and a three-phase inverter circuit constructed with the half bridge circuit.

2. Description of the Related Art

For example, PTL 1 discloses a technology associated with the half bridge circuit. The half bridge circuit including IGBT (Insulated Gate Bipolar Transistor) switch elements 41 and 43 is illustrated in FIG. 18 of PTL 1. FWDs (Free Wheel Diodes) 42 and 44 are connected in anti-parallel to IGBT switch elements 41 and 43.

CITATION LIST

Patent Literature

PTL 1: Unexamined Japanese Patent Publication No. 2011-193705

However, a large amount of switching energy is consumed during turn-on or turn-off of the FWD included in the half bridge circuit of PTL 1. For example, the consumed energy is $(1/2) \times C \times Va \times Va$ when a capacitor having capacity C is charged such that a voltage of 0 V becomes Va. It is assumed that an output voltage of a switch element of the half bridge circuit changes from an L level (0 V) to an H level (input voltage Vdc at the half bridge circuit) every time the switch element performs switching operation, that the half bridge circuit includes the two FWDs connected in parallel to each other, and that the FWD has an anode-cathode parasitic capacitance of Cak. In this case, every time the half bridge circuit performs the switching operation, switching energy of $Cak \times Vdc \times Vdc$ is consumed to increase a switching loss. The increase in switching loss caused by the FWD becomes troublesome in a high-frequency switch.

SUMMARY OF THE INVENTION

An object of the present disclosure is to provide a half bridge circuit that can decrease the switching loss.

A half bridge circuit according to one aspect of the present disclosure includes a half bridge driver that includes an upper arm and a lower arm, and a control circuit that controls the upper arm and the lower arm. The upper arm includes a first switch element, the lower arm includes a second switch element. The first switch element and the second switch element are a semiconductor element including a first terminal that controls a current and second and third terminals that input and output the current. When a voltage between the first terminal and the third terminal or a voltage between the first terminal and the second terminal is greater than or equal to a threshold voltage, a current is passed from the second terminal to the third terminal or from the third terminal to the second terminal according to a polarity of the voltage between the second terminal and the third terminal. When the current is passed from the third terminal to the second terminal, the voltage between the second terminal and the third terminal changes with respect to the voltage applied between the first terminal and the third terminal within a range where the voltage between the first terminal and the third terminal is less than or equal to the threshold voltage. In a voltage applied to perform turn-off control of the first switch element and the second switch element, a substantial zero voltage and a negative bias voltage are switched between the first terminal and the third terminal. The voltage applied between the first terminal and the third terminal to perform turn-off control of a first switch element is switched to a substantial zero voltage before the second switch element is controlled to turn off.

Even if the "upper arm" and the "lower arm" are replaced with each other in the half bridge circuit, the half bridge circuit having the similar function can be provided. A configuration of the half bridge circuit having the similar function is also included in the above half bridge circuit.

The switching loss can be decreased in the half bridge circuit of the present disclosure. The half bridge circuit that can decrease the switching loss is particularly useful for the high-frequency switch.

BRIEF DESCRIPTION OF DRAWINGS

FIG. 2B is a view illustrating an electric characteristic of an IGBT switch element according to a comparative example;

DETAILED DESCRIPTION OF THE PREFERRED EMBODIMENTS (Configuration of Half Bridge Circuit)

Figure 1:
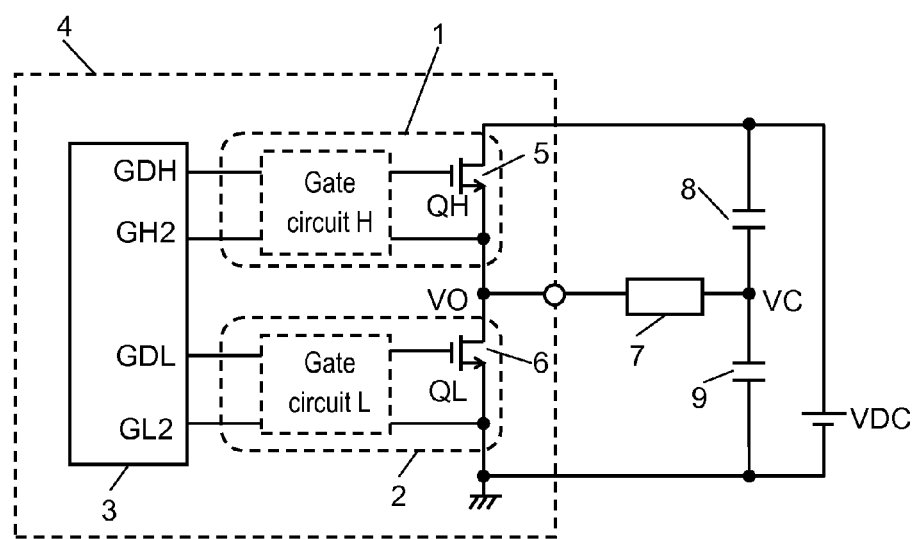
FIG. 1 is a view illustrating a configuration of a half bridge circuit and peripheral elements thereof.

FIG. 1 is a view illustrating a configuration of a half bridge circuit common to each exemplary embodiment of the present disclosure and peripheral elements thereof.

As illustrated in FIG. 1, half bridge circuit 4 includes upper arm 1, lower arm 2, and control circuit 3. Upper arm 1 includes first switch element 5 and gate circuit H, and lower arm 2 includes second switch element 6 and gate circuit L. Control signals GDH and GH2 are output from control circuit 3 to upper arm 1, and control signals GDL and GL2 are output from control circuit 3 to lower arm 2. Signal GDH controls on and off of first switch element 5 of upper arm 1, and signal GDL controls on and off of second switch element 6 of lower arm 2. Control signals GDH and GDL turn off the switch element at an L level, and turn on switch element at an H level. When control signals GDH and GDL turn off the switch element at the L level, control signals GH2 and GL2 perform switching control whether a control terminal voltage at the switch element is switched to a substantial zero voltage or a negative bias voltage. In the present disclosure, it is assumed that control signals GH2 and GL2 put the control terminal voltage into the substantial zero voltage at the H level, and that control signals GH2 and GL2 put the control terminal voltage into the negative bias voltage at the L level. As used herein, the control terminal voltage means a voltage between the first terminal and the third terminal (to be described later).

As illustrated in FIG. 1, in a structure of half bridge circuit 4, output voltage Vo is output at a connection point (output terminal) where the two switch elements are connected, output voltage Vo is applied from the connection point toward load 7, and current IL is passed from load 7 toward the connection point. A gate terminal of each switch element corresponds to the first terminal, and input and output terminals correspond to the second terminal and the third terminal. Therefore, the third terminal at first switch element 5 and the second terminal at second switch element 6 are electrically connected to each other, the second terminal at first switch element 5 is connected to a positive electrode side of a VDC, and the third terminal at second switch element 6 is connected to GND.

At this point, any gate circuit H and any gate circuit L may be used as long as control signals GDH, GH2, GDL, and GL2 are input to gate circuit H and gate circuit L to control the control terminal voltage at the switch element.

The first terminal acts as a control terminal that controls the current passed through first switch element 5 and second switch element 6. When the voltage between the first terminal and the third terminal or the voltage between the first terminal and the second terminal is greater than or equal to a threshold voltage, the current at first switch element 5 and second switch element 6 has a feature that current is passed from the second terminal to the third terminal or from the third terminal to the second terminal according to a polarity of the voltage between the second terminal and the third terminal.

When the voltage between the first terminal and the third terminal is less than or equal to the threshold voltage, and when the current is passed from the third terminal to the second terminal, first switch element 5 and second switch element 6 have a feature that the voltage between the second terminal and the third terminal changes in response to the voltage applied between the first terminal and the third terminal.

(Switch Element)

The features of the switch element according to each exemplary embodiment of the present disclosure in FIG. 1 will be described in detail with reference to FIGS. 2A, 2B, and 2C.

Figure 2A:
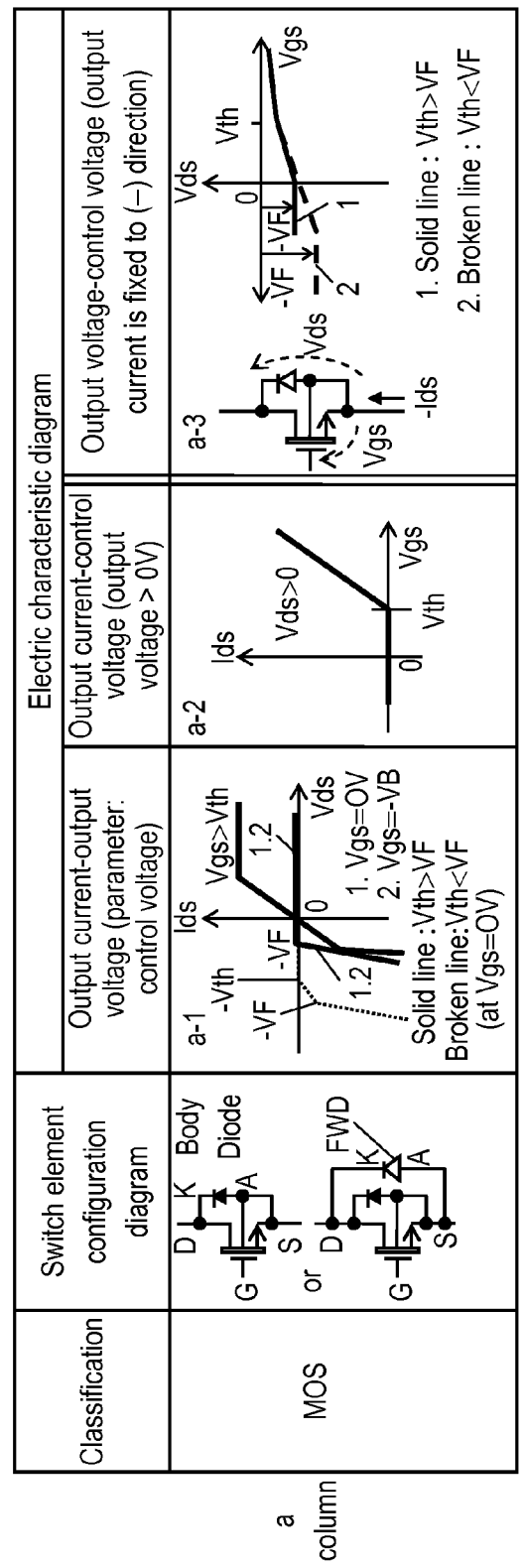
FIG. 2A is a view illustrating an electric characteristic of a MOS switch element according to a comparative example.
Figure 2C:
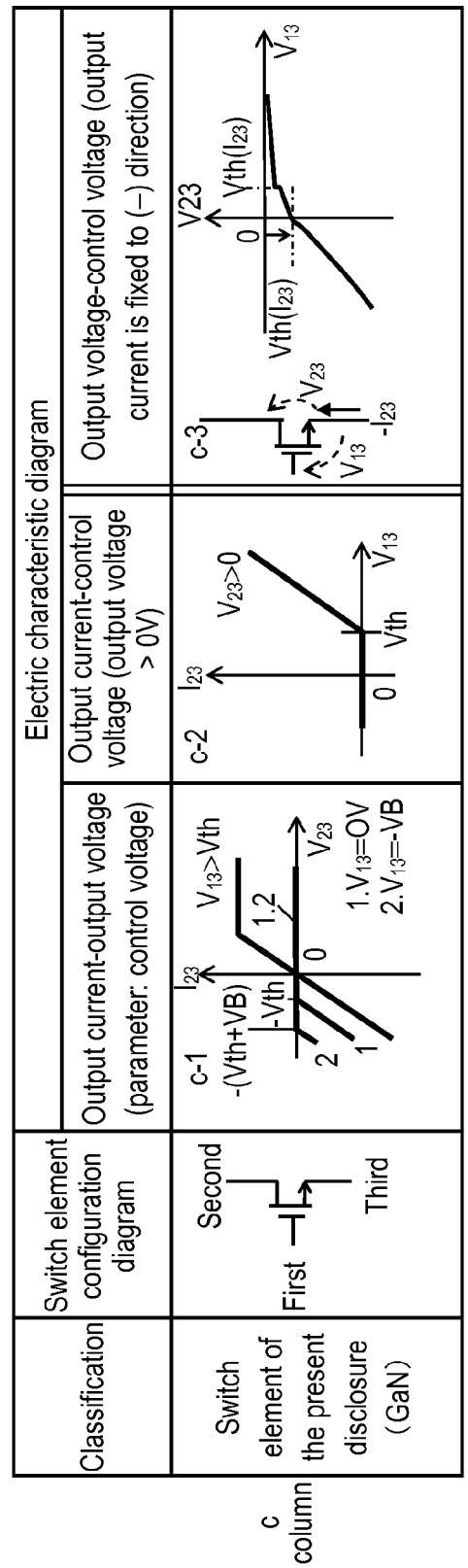
FIG. 2C is a view illustrating an electric characteristic of a switch element according to first and second exemplary embodiments of the present disclosure.

FIG. 2A illustrates an electric characteristic of a MOS switch element of a comparative example, FIG. 2B illustrates an electric characteristic of an IGBT switch element of a comparative example, and FIG. 2C illustrates an electric characteristic of first and second exemplary embodiments of the present disclosure.

(Switch Element of Comparative Example)

As illustrated in FIGS. 2A and 2B, in the switch elements (conventional MOS switch element and IGBT switch element) of the comparative examples, a parasitic diode or the FWD is connected in anti-parallel to a MOS transistor or the IGBT for a structural reason. Therefore, the switching loss of the half bridge circuit increases by a parasitic capacitance of the FWD that is connected in anti-parallel to a parasitic capacitance of the transistor of the switch element. The parasitic diode or FWD connected in anti-parallel also has an influence on the electric characteristic of the switch element.

The electric characteristic of the MOS switch element of the comparative example will be described with reference to fields a-1 and a-3 in FIG. 2A. As illustrated in field a-1, Ids (the current between a drain terminal and the source terminal) can be passed when Vgs (the voltage between a gate terminal and a source terminal) is larger than Vth (threshold voltage). However, in the case that Ids is negative, namely, in the case that the current is passed from the source terminal to the drain terminal, due to the FWD or the parasitic diode, Vds of an Ids-Vds characteristic becomes a characteristic curve having a shape in which Vds is clamped by VF (a forward voltage of the FWD or parasitic diode) irrespective of Ids (Vds is fixed to −VF irrespective of Ids). In the case that Ids is passed as illustrated in field a-3 in FIG. 2A, Vds is fixed to −VF irrespective of Vgs in a region of Vgs<0. In field a-1, for Vgs=0 V or Vgs=−VB, Ids is passed through the parasitic diode or the FWD. In this case, Vds is equal to VF, and a change in Vds for a change in Ids becomes identical to a change in VF (see fields a-1 and a-3 in FIG. 2A).

The electric characteristic of the IGBT switch element will be described below with reference to fields b-1 and b-3 in FIG. 2B. Due to a structural problem, in the IGBT switch element, the current is passed from a collector terminal to an emitter terminal while the current is not passed from the emitter terminal to the collector terminal. The FWD is connected in anti-parallel to the IGBT switch element in order to compensate the characteristic of the IGBT switch element. As illustrated in field b-1, Ice (the current between the collector terminal and the emitter terminal) can be passed when Vge (the voltage between the gate terminal and the emitter terminal) is larger than Vth (threshold voltage). However, due to the FWD, Vce of an Ice-Vce characteristic becomes a characteristic curve having a shape in which Vce is clamped at VF (the forward voltage of the FWD) irrespective of Ice (Vce is fixed to −VF irrespective of Ice). In the case that Ice is passed as illustrated in field b-3 in FIG. 2B, Vce is fixed to −VF irrespective of Vge. In field b-1, for Vge=0 V or Vge=−VB, Ice is passed from the emitter terminal to the collector terminal through the FWD. In this case, Vce is equal to VF, and a change in Vce for a change in Ice becomes identical to a change in VF (see fields b-1 and b-3 in FIG. 2B).

At this point, it is considered that the conventional MOS switch element or IGBT switch element is used as the upper arm and lower arm of the half bridge circuit. In the half bridge circuit, when the current is passed to the source terminal or emitter terminal of the turned-off switch element during DT (in a state in which the switch elements of the upper arm and lower arm are turned off), Vds or Vce becomes −VF irrespective of Vgs or Vge of the turned-off switch element. Therefore, the half bridge circuit has the feature that the switching loss during DT does not change even if Vgs or Vge of the turned-off switch element is put into the negative bias voltage in order to prevent false firing. On the other hand, because the half bridge circuit includes the FWD, the half bridge circuit has the switching loss caused by the parasitic capacitance of the FWD.

(Switch Element of Exemplary Embodiment of the Present Disclosure)

On the other hand, as illustrated in switch element configuration diagram of FIG. 2C, the semiconductor element, such as the FWD, which has the parasitic capacitance, is not connected to the switch element in FIG. 1. Therefore, the switching loss of the half bridge circuit can be decreased compared with the conventional MOS switch or IGBT switch.

The electric characteristic of the switch element in FIG. 1 will be described below with reference to fields c-1 and c-3 in FIG. 2C.

As illustrated in field c-1, I23 (the current between the second terminal and the third terminal) can be passed when V13 (the voltage between the first terminal and the third terminal) is larger than Vth (threshold voltage). Because of non-existence of the FWD in the switch element, an I23-V23 characteristic is not clamped by VF. That is, the current can be passed from the second terminal to the third terminal or from the third terminal to the second terminal according to the polarity of the voltage between the second terminal and the third terminal.

As illustrated in field c-3, in the switch element, V23 (the voltage between the second terminal and the third terminal) changes with respect to V13 (the voltage between the first terminal and the third terminal) when the current is passed from the third terminal to the second terminal.

At this point, it is considered that the switch element of each exemplary embodiment of the present disclosure is used as the upper arm and lower arm of the half bridge circuit. In the half bridge circuit, when the current is passed to the third terminal of the turned-off switch element during DT, V23 of the turned-off switch element depends on V13. Voltage V23 swings to a negative direction when V13 of the turned-off switch element is put into the negative bias voltage in order to prevent the false firing. Therefore, the half bridge circuit has the feature that the switching loss during DT increases. On the other hand, because the half bridge circuit does not include the FWD, the switching loss can be decreased by the parasitic capacitance of the FWD.

(Method for Decreasing Switching Loss During DT of Switch Element According to Exemplary Embodiment of the Present Disclosure)

As described above, in the half bridge circuit in which the switch element of each exemplary embodiment of the present disclosure is used, the switching loss during DT increases only by putting V13 of the turned-off switch element into the negative bias voltage in order to prevent the false firing. A method for decreasing the switching loss during DT will be described below as first and second exemplary embodiments with reference to FIGS. 3A, 3B, 3C, 3D, 4A, 4B, 4C, 4D, 5A, 5B, 5C, 5D, and 5E.

The terms of "substantial zero voltage" and "negative bias voltage" used herein are used for the purpose of the simplified description. The actual meaning is as follows. That is, the term "substantial zero voltage" means a voltage range between an upper limit voltage set to a voltage less than or equal to threshold voltage Vth of the control terminal voltage of the switch element and a lower limit voltage set to a negative voltage in which the switching loss during DT falls within a design permissive value. The term "negative bias voltage" means a voltage range between an upper limit voltage set to the control terminal voltage of the turned-off switch element at which the false firing of the switch element can be prevented and a lower limit voltage that is not particularly defined.

First Exemplary Embodiment

First operation and second operation of the first exemplary embodiment will be described below. The same holds true for the description of the second operation, when the "upper arm" in the description of the first operation is replaced with the "lower arm" while the "lower arm" in the description of the first operation is replaced with the "upper arm".

(First Operation of First Exemplary Embodiment)

Figure 3A:
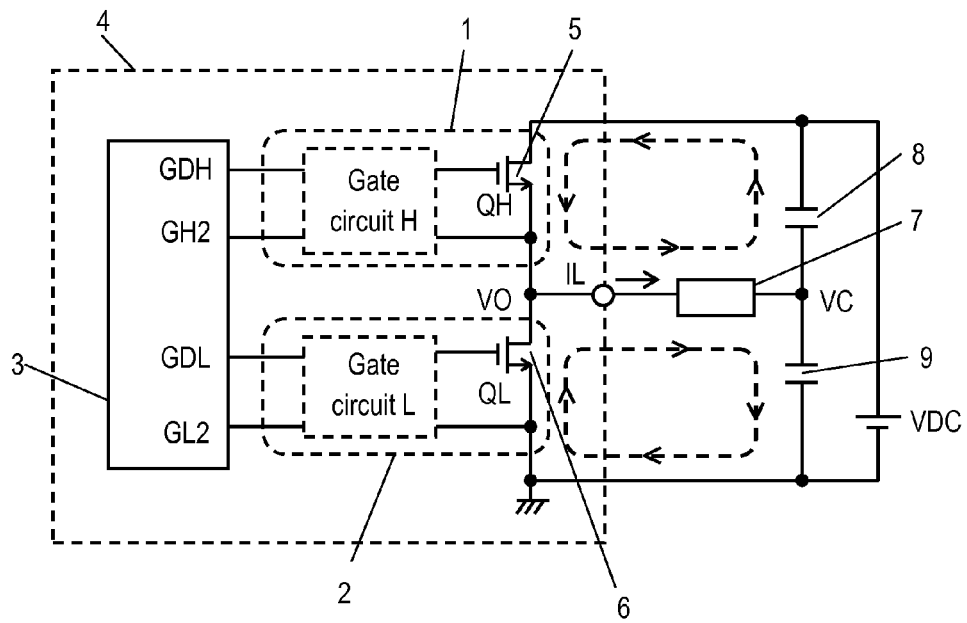
FIG. 3A is a view illustrating first operation of the first exemplary embodiment of the present disclosure.
Figure 3B:
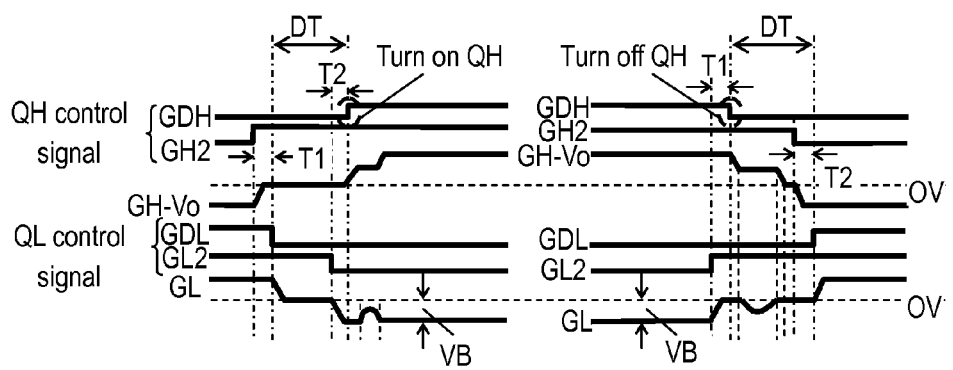
FIG. 3B is a view illustrating the first operation of the first exemplary embodiment of the present disclosure.
Figure 3C:
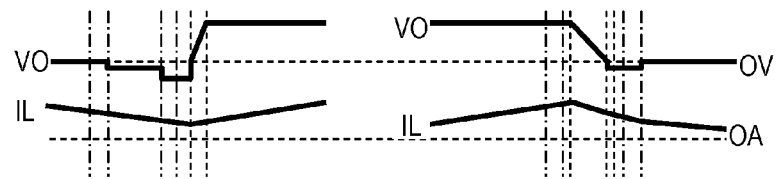
FIG. 3C is a view illustrating the first operation of the first exemplary embodiment of the present disclosure.
Figure 3D:
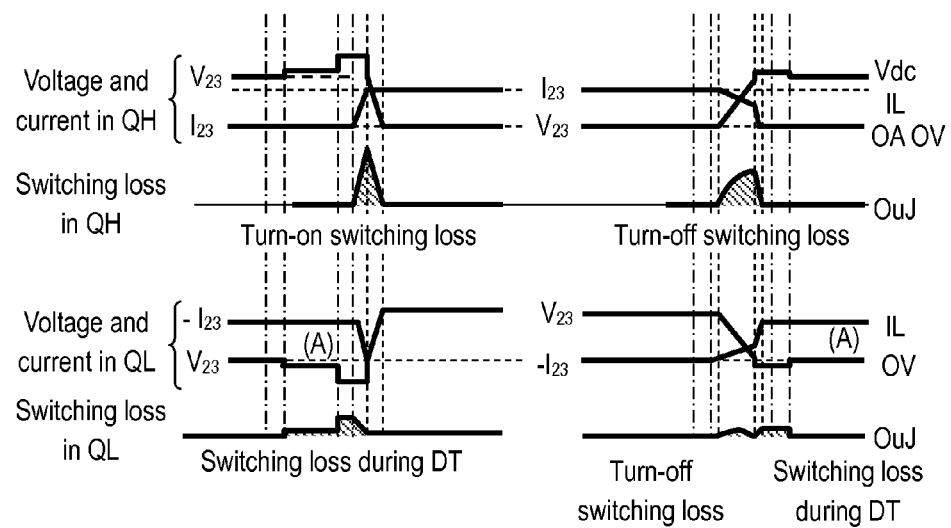
FIG. 3D is a view illustrating the first operation of the first exemplary embodiment of the present disclosure.

FIGS. 3A, 3B, 3C, and 3D are views illustrating the first operation of the first exemplary embodiment of the present disclosure. In the first operation, a frequency response characteristic of load current IL for the applied voltage of half bridge circuit 4 to load 7 is delayed with respect to a switching operation frequency of half bridge circuit 4. Therefore, load current IL is passed only in one direction irrespective of the switching operation of output voltage Vo of half bridge circuit 4. FIGS. 3A, 3B, 3C, and 3D are explanatory views illustrating operation when an average voltage of output voltages Vo is larger than connection point voltage Vc of load 7, first capacitor 8, and second capacitor 9. Specifically, FIG. 3A is a view illustrating a flow of current IL passed from half bridge circuit 4 to load 7. FIG. 3B is a timing chart of the control signals output from control circuit 3 to upper arm 1 and lower arm 2 and a change in voltage between the first terminal and the third terminal of the switch element included in each arm. It is assumed that GH−Vo is a voltage between the first terminal and the third terminal of first switch element 5 included in upper arm 1, and that GL is a voltage between the first terminal and the third terminal of second switch element 6 included in lower arm 2. FIG. 3C is a view illustrating a change in output voltage Vo of the half bridge circuit and a change in load current IL passed through load 7 according to the timing chart of each control signal in FIG. 3B. FIG. 3D is a view illustrating changes in V23 and I23 of second switch element 6 of each arm and a change in switching loss according to the timing chart of each control signal in FIG. 3B.

As illustrated in FIG. 3A, because the configurations of half bridge circuit 4 and its peripheral elements are identical to those in FIG. 1, the description is omitted.

A process of generating a signal in control circuit 3 of the first exemplary embodiment will be described below. The description of the drawing and numeral in control circuit 3 is omitted.

See the above description (the description associated with the configuration of the half bridge circuit) for the H-level and L-level functions of control signals GDH, GDL, GH2, and GL2.

Control circuit 3 generates control signals GDH and GL2 from driving signal GDH0 (not illustrated) driving upper arm 1. Control signal GDH is the signal in which driving signal GDH0 is delayed by time T.

In order to turn off first switch element 5 of upper arm 1, a transition of control signal GDH from the H level to the L level is made after time T since a transition of driving signal GDH0 from the H level to the L level. A transition of control signal GL2 from the L level to the H level is made before time T1 from a time point of the transition of control signal GDH from the H level to the L level. In order to turn on first switch element 5 of upper arm 1, the transition of control signal GDH from the L level to the H level is made after time T since the transition of driving signal GDH0 from the L level to the H level. The transition of control signal GL2 from the H level to the L level is made before time T2 from the time point of the transition of control signal GDH from the L level to the H level.

Control circuit 3 generates control signals GDL and GH2 from driving signal GDL0 (not illustrated) driving lower arm 2. Control signal GDL is the signal in which driving signal GDL0 is delayed by time T.

In order to turn off second switch element 6 of lower arm 2, the transition of control signal GDL from the H level to the L level is made after time T since the transition of driving signal GDL0 from the H level to the L level. The transition of control signal GH2 from the L level to the H level is made before time T1 from the time point of the transition of control signal GDL from the H level to the L level. In order to turn on second switch element 6 of lower arm 2, the transition of control signal GDL from the L level to the H level is made after time T since the transition of driving signal GDL0 from the L level to the H level. The transition of control signal GH2 from the H level to the L level is made before time T2 from the time point of the transition of control signal GDL from the L level to the H level.

The action of control circuit 3 on half bridge circuit 4 will be described below. As illustrated in FIG. 3B, it is considered that control signal GL2 is changed before time T1 from the time point control signal GDH output to first switch element 5 of upper arm 1 is turned off. At this point, control signal GL2 is changed such that voltage GL between the first terminal and the third terminal becomes the substantial zero voltage, voltage GL being the current control voltage of turned-off second switch element 6 of lower arm 2. Therefore, as illustrated in FIG. 3C, Vo becomes the substantial zero voltage or less in period DT (the period in which the switch elements of upper arm 1 and lower arm 2 are continuously tuned off) after time T1 since the change of control signal GL2. Because current control voltage V13 (GL) of second switch element 6 of lower arm 2 becomes the substantial zero voltage, voltage V23 of second switch element 6 of lower arm 2 substantially becomes −Vth (see field c-3 in FIG. 2C). That is, the switching loss during DT can substantially be equalized to that of the conventional switch element (see FIGS. 2A and 2B).

In the case that V13 (GL) of second switch element 6 of lower arm 2 is kept at the substantial zero voltage, as illustrated in FIG. 3B, there is a risk of generating the false firing in second switch element 6 of lower arm 2 when control signal GDH output to first switch element 5 of upper arm 1 is turned on. This is because the following mechanism works. At first, the increase in current control voltage V13 (GH−Vo) of first switch element 5 of upper arm 1 decreases voltage V23 of first switch element 5 of upper arm 1. This phenomenon indicates a result in the case that V13 increases while I23 is fixed to a certain value in a first quadrant (the region of I23>0 and V23>0) of field c-1 in FIG. 2C. In this case, a gradient of a characteristic curve of V13>Vth becomes steeper, V23 decreases with respect to certain fixed value I23 according to the increase of V13. As a result, Vo increases. When Vo increases, V13 (GL) of second switch element 6 increases due to a parasitic capacitance between the second terminal and the first terminal of second switch element 6 of lower arm 2 (not illustrated). As a result, there is a risk of generating the false firing. In the first exemplary embodiment, before time T2 from the time control signal GDH output to first switch element 5 of upper arm 1 is turned on, control signal GL2 is changed such that current control voltage V13 (GL) of second switch element 6 in the off state (the state in which current control voltage V13 (GL) of second switch element 6 of lower arm 2 becomes the substantial zero voltage) of lower arm 2 becomes the negative bias voltage. Through the control, there is an effect that an excess of voltage GL over the substantial zero voltage, which is caused by the turn-on of first switch element 5, is eliminated to be able to prevent the generation of the false firing.

In the case that load current IL is passed from half bridge circuit 4 to load 7, load current IL is passed from the third terminal of second switch element 6 toward the second terminal during DT in which both first switch element 5 and second switch element 6 are turned off.

As described above, in the first exemplary embodiment, the FWD is not connected in parallel to the switch element, whereby the switching loss caused by the parasitic capacitance of the FWD is decreased to prevent the false firing. Additionally, the switching loss during DT can be decreased with the same degree as the parallel connection of the FWD to the switch element. This can also be seen from FIG. 3D.

Because the anode-cathode parasitic capacitance of the FWD is substantially equal to a Coss parasitic output capacity of the switch element, the switching loss caused by the parasitic capacitance can be decreased to a half than before in the half bridge circuit of the exemplary embodiment of the present disclosure.

(Second Operation of First Exemplary Embodiment)

Figure 4A:
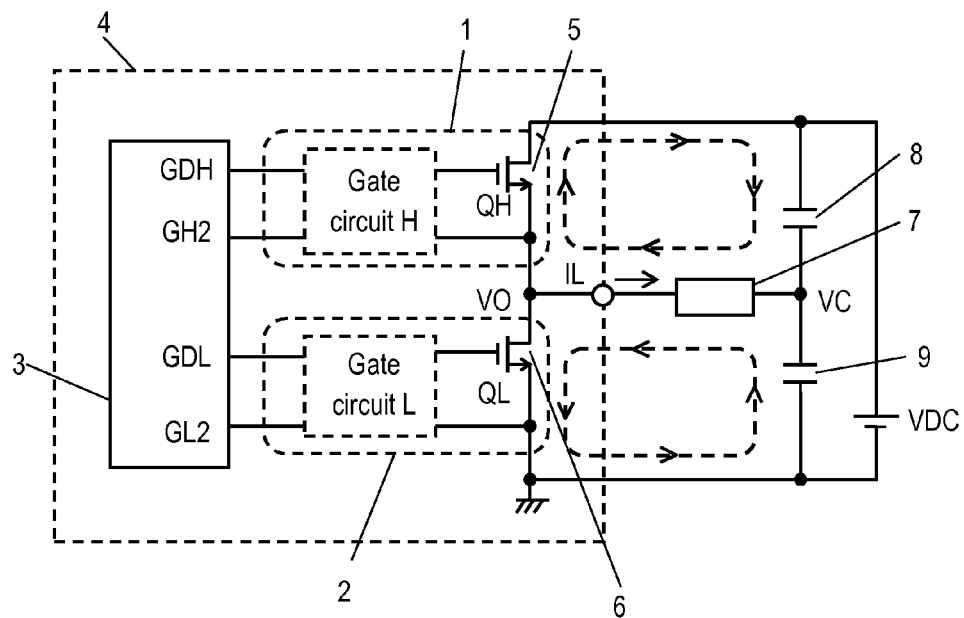
FIG. 4A is a view illustrating second operation of the first exemplary embodiment of the present disclosure.
Figure 4B:
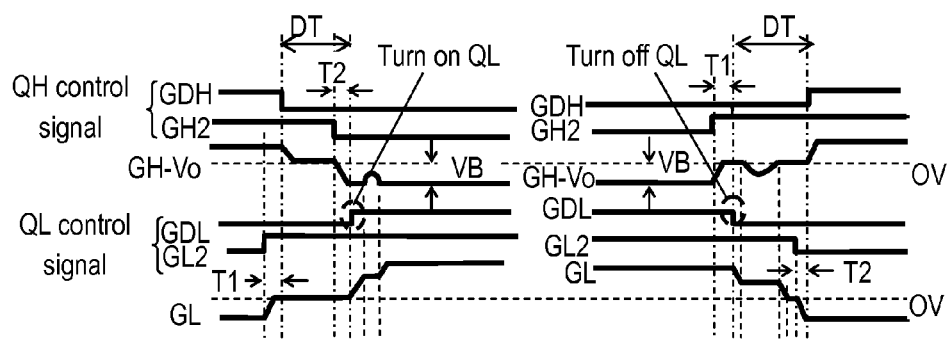
FIG. 4B is a view illustrating the second operation of the first exemplary embodiment of the present disclosure.
Figure 4C:
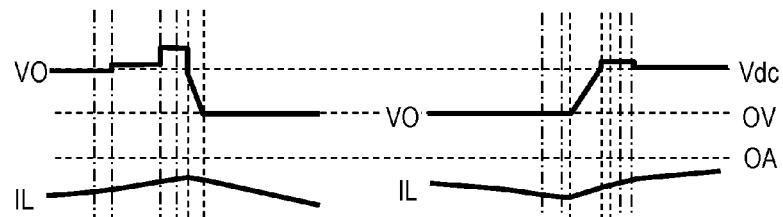
FIG. 4C is a view illustrating the second operation of the first exemplary embodiment of the present disclosure.
Figure 4D:
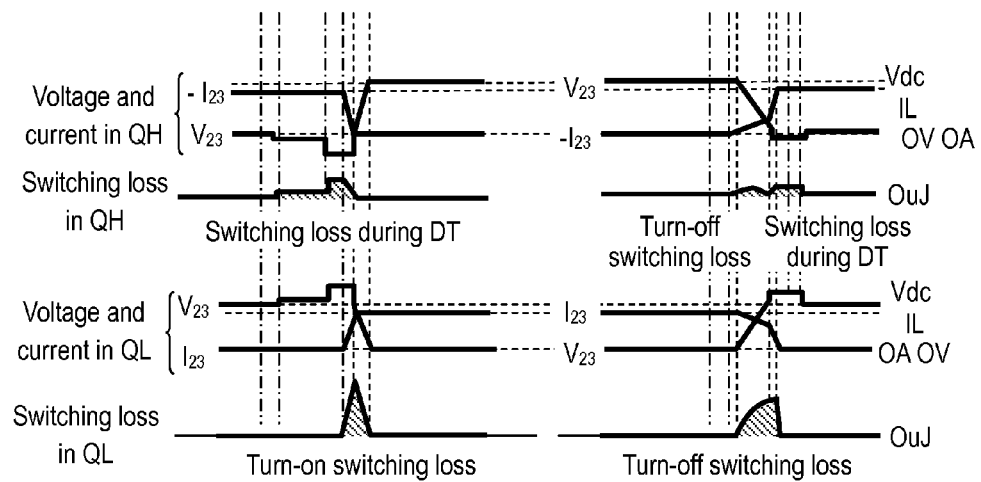
FIG. 4D is a view illustrating the second operation of the first exemplary embodiment of the present disclosure.

FIGS. 4A, 4B, 4C, and 4D are views illustrating second operation of the first exemplary embodiment of the present disclosure. In the second operation, the frequency response characteristic of load current IL for the applied voltage of half bridge circuit 4 to load 7 is delayed with respect to the switching operation frequency of half bridge circuit 4. Therefore, load current IL is passed only in one direction irrespective of the switching operation of output voltage Vo of half bridge circuit 4. FIGS. 4A, 4B, 4C, and 4D are explanatory views illustrating operation when an average voltage of output voltages Vo is smaller than connection point voltage Vc of load 7, first capacitor 8, and second capacitor 9. Specifically, FIG. 4A is a view illustrating a flow of current IL passed from load 7 to half bridge circuit 4. FIG. 4B is a timing chart of the control signals output from control circuit 3 to upper arm 1 and lower arm 2 and a change in voltage between the first terminal and the third terminal of the switch element included in each arm. FIG. 4C is a view illustrating changes in Vo and IL according to the timing chart of each control signal in FIG. 4B. FIG. 4D is a view illustrating changes in V23 and I23 of the switch element of each arm and a change in switching loss according to the timing chart of each control signal in FIG. 4B.

As illustrated in FIG. 4A, because the configurations of half bridge circuit 4 and its peripheral elements are identical to those in FIG. 1, the description is omitted.

As illustrated in FIG. 4A, it is considered that control signal GH2 is changed before time T1 from the time point control signal GDL output to second switch element 6 of lower arm 2 is turned off. At this point, control signal GH2 is changed such that current control voltage V13 (GH−Vo) of first switch element 5 in the off state of upper arm 1 becomes the substantial zero voltage. Therefore, as illustrated in FIG. 4C, Vo substantially becomes Vdc or more in period DT after time T1 since control signal GH2 is changed. Because current control voltage V13 (GH−Vo) of first switch element 5 of upper arm 1 becomes the substantial zero voltage, V23 of first switch element 5 of upper arm 1 substantially becomes −Vth (see field c-3 in FIG. 2C). That is, the switching loss during DT can substantially be equalized to that of the conventional switch element (the switch elements described in a column of FIG. 2A and b column of FIG. 2B).

As illustrated in FIG. 4B, when control signal GDL output to second switch element 6 of lower arm 6 is turned on, there is a risk of generating the false firing in first switch element 5 of upper arm 1. This is because the following mechanism works. At first, the increase in current control voltage V13 (GL) of second switch element 6 of lower arm 2 decreases V23 of second switch element 6 of lower arm 2. This phenomenon is identical to the decrease in V23 of first switch element 5 of upper arm 1 in the first operation of the first exemplary embodiment, the description is omitted. As a result of the decrease in V23, Vo decreases. Then, first terminal voltage GH of first switch element 5 of upper arm 1 decreases according to the decrease of Vo (GH−Vo is kept at a substantially constant value). When GH decreases, V23 (GH−Vo) of first switch element 5 increases due to the parasitic capacitance between the second terminal and the first terminal of first switch element 5 of lower arm 1 (not illustrated). As a result, there is a risk of generating the false firing. In the first exemplary embodiment, before time T2 from the time control signal GDL output to second switch element 6 of lower arm 2 is turned on, control signal GH2 is changed such that current control voltage V13 (GH−Vo) of first switch element 5 in the off state (the state in which current control voltage V13 (GH−Vo) of first switch element 5 of upper arm 1 becomes the substantial zero voltage) of upper arm 1 becomes the negative bias voltage. Through the control, there is an effect that an excess of voltage GH−Vo over the substantial zero voltage, which is caused by the turn-on of second switch element 6, is eliminated to be able to prevent the generation of the false firing.

In the case that load current IL is passed from load 7 to half bridge circuit 4, load current IL is passed from the third terminal of first switch element 5 toward the second terminal during DT in which both first switch element 5 and second switch element 6 are turned off.

As described above, in the first exemplary embodiment, the FWD is not connected in parallel to the switch element, whereby the switching loss caused by the parasitic capacitance of the FWD is decreased to prevent the false firing. Additionally, the switching loss during DT can be decreased with the same degree as the parallel connection of the FWD to the switch element. This can also be seen from FIG. 4D.

Because the anode-cathode parasitic capacitance of the FWD is substantially equal to a Coss parasitic output capacity of the switch element, the switching loss caused by the parasitic capacitance can be decreased to a half than before in the half bridge circuit of the exemplary embodiment of the present disclosure.

As described above, the same holds true for the description of the second operation, when the "upper arm" in the description of the first operation is replaced with the "lower arm" while the "lower arm" in the description of the first operation is replaced with the "upper arm".

Second Exemplary Embodiment

Figure 5A:
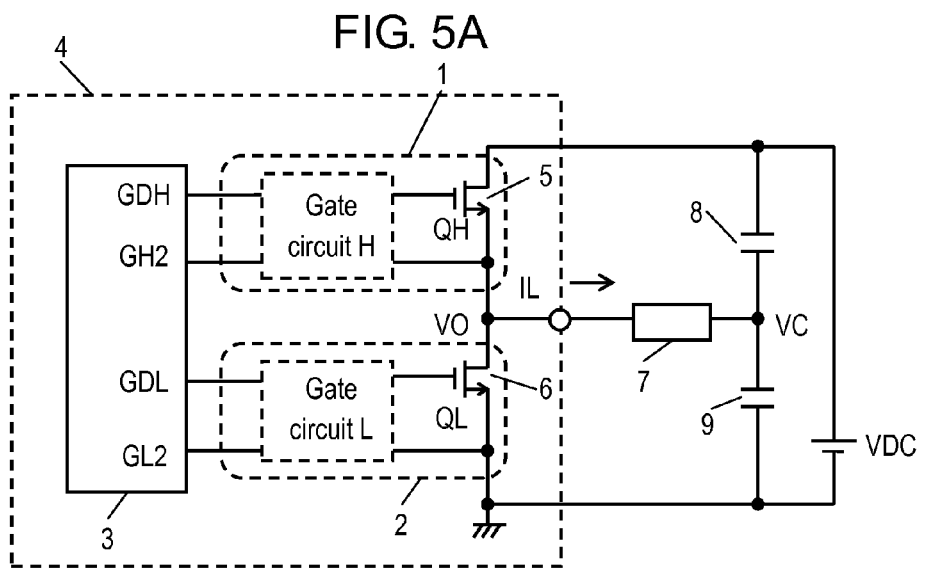
FIG. 5A is a view illustrating operation of the second exemplary embodiment of the present disclosure.
Figure 5B:
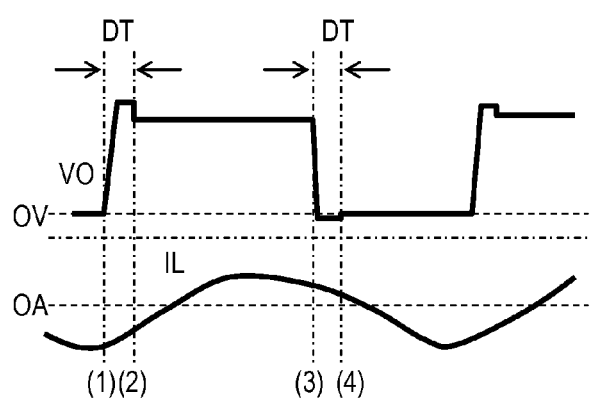
FIG. 5B is a view illustrating the operation of the second exemplary embodiment of the present disclosure.
Figure 5C:
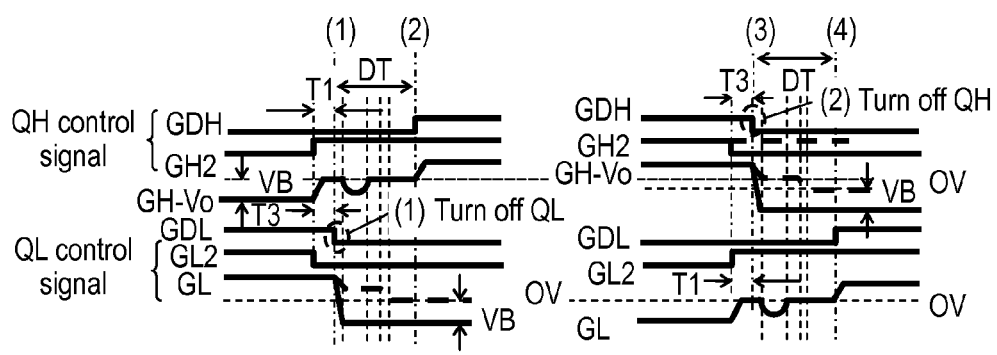
FIG. 5C is a view illustrating the operation of the second exemplary embodiment of the present disclosure.
Figure 5D:
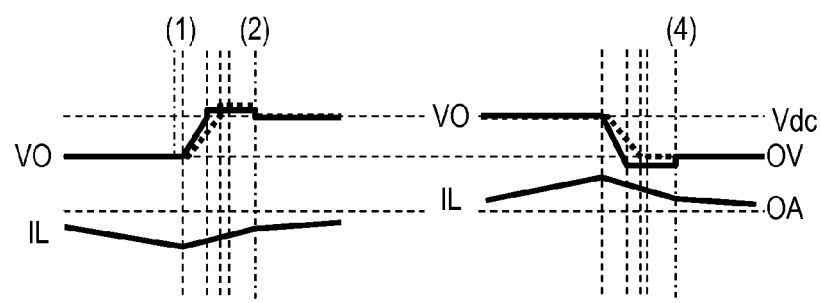
FIG. 5D is a view illustrating the operation of the second exemplary embodiment of the present disclosure.
Figure 5E:
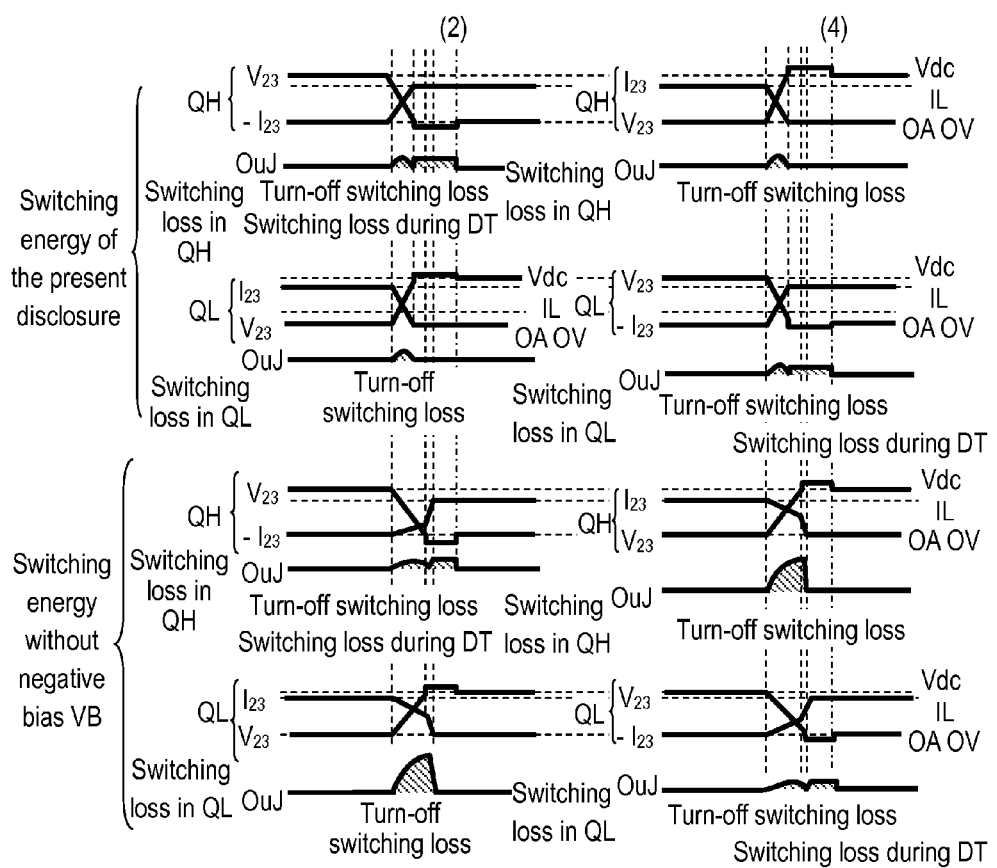
FIG. 5E is a view illustrating the operation of the second exemplary embodiment of the present disclosure.

FIG. 5A is a view illustrating a flow of current IL passed between half bridge circuit 4 and load 7. FIG. 5B is a waveform chart illustrating a relationship between output voltage Vo and load current IL of half bridge circuit 4. FIG. 5C is a timing chart of the control signals output from control circuit 3 to upper arm 1 and lower arm 2 and a change in voltage between the first terminal and the third terminal of the switch element included in each arm. FIG. 5D is a view illustrating changes in Vo and IL according to the timing chart of each control signal in FIG. 5C. FIG. 5E is a view illustrating changes in V23 and I23 of the switch element of each arm and a change in switching loss according to the timing chart of each control signal in FIG. 5C.

As illustrated in FIG. 5A, because the configurations of half bridge circuit 4 and its peripheral elements are identical to those in FIG. 1, the description is omitted.

A process of generating a signal in control circuit 3 of the first exemplary embodiment will be described below. The description of the drawing and numeral in control circuit 3 is omitted.

See the above description (the description associated with the configuration of the half bridge circuit) for the H-level and L-level functions of control signals GDH, GDL, GH2, and GL2.

Control circuit 3 generates control signal GDH from driving signal GDH0 (not illustrated) of upper arm 1. Control circuit 3 generates control signal GDL from driving signal GDL0 (not illustrated) of lower arm 2. Control signal GDH is the signal in which driving signal GDH0 is delayed by time T. Control signal GDL is the signal in which driving signal GDL0 is delayed by time T. Control signals GH2 and GL2 are generated from driving signals GDH0 and GDL0.

The transition of control signal GDH from the H level to the L level is made after time T since the transition of driving signal GDH0 from the H level to the L level. The transition of control signal GL2 from the L level to the H level is made before time T1 from the time point of the transition of control signal GDH from the H level to the L level. The transition of control signal GH2 from the H level to the L level is made before time T3 from the time point of the transition of control signal GDH from the H level to the L level. However, because control signal GDH is located at the H level in the moment control signal GH2 changes, the voltage GH−Vo between the first terminal and the third terminal of first switch element 5 is neither the substantial zero voltage nor the negative bias voltage, but the positive voltage. The voltage GH−Vo between the first terminal and the third terminal of first switch element 5 becomes the negative bias voltage from the moment the control signal GDH makes a transition to the L level.

The transition of control signal GDL from the H level to the L level is made after time T since the transition of driving signal GDL0 from the H level to the L level. The transition of control signal GH2 from the L level to the H level is made before time T1 from the time point of the transition of control signal GDL from the H level to the L level. Similarly, the transition of control signal GL2 from the H level to the L level is made before time T3 from the time point of the transition of control signal GDL from the H level to the L level. However, because control signal GDL is located at the H level in the moment control signal GL2 changes, the voltage GL between the first terminal and the third terminal of second switch element 6 is neither the substantial zero voltage nor the negative bias voltage, but the positive voltage. The voltage GL between the first terminal and the third terminal of second switch element 6 becomes the negative bias voltage from the moment the control signal GDL makes a transition to the L level.

The action of control circuit 3 on half bridge circuit 4 will be described below.

In FIG. 5A, it is assumed that the frequency response characteristic of load current IL with respect to the voltage applied to load 7 has the feature that a phase is delayed. When the switching frequency of output voltage Vo of half bridge circuit 4 is slightly higher or lower than a resonant frequency or a cut-off frequency of the frequency characteristic of the load current IL passed through load 7, as illustrated in FIG. 5B, load current IL exerts the phase that is delayed with respect to the switching operation of output voltage Vo of half bridge circuit. The half bridge circuit that performs the operation in FIG. 5B is referred to as a half bridge circuit that performs resonance inverter operation.

In FIG. 5B, in a period (the period from time point (1) to time point (2)) in which Vo makes a transition from the L level (Gnd level or substantial 0 V level) to the H level (substantial Vdc level), IL is passed in the negative direction, namely, from load 7 to half bridge circuit 4. In a period in which Vo makes a transition from the H level to the L level (the period from time point (3) to time point (4)), IL is passed in the positive direction, namely, from half bridge circuit 4 to load 7.

The operations of first switch element 5 of upper arm 1 and second switch element 6 of lower arm 2 at time point (1) or time point (2) will be described in detail with reference to FIG. 5C.

As illustrated in FIG. 5C, the transition of Vo from the L level to the H level (see period DT from time point (1) to time point (2)) is generated by turning off second switch element 6 of lower arm 2. First switch element 5 is turned on after period DT in which both first switch element 5 and second switch element 6 are in the off state (see time point (2)).

In the transition of Vo from the L level to the H level, control terminal voltage V13 (GH–Vo) of first switch element 5 in the off state is influenced by the parasitic capacitance between the first terminal and the second terminal of first switch element 5. However, as illustrated in FIG. 5C, the false firing of first switch element 5 is not generated because control voltage V13 (GH–Vo) of first switch element 5 is swung to the negative voltage side in the transition of Vo from the L level to the H level (see period DT from time point (1) to time point (2)).

Output voltage Vo of half bridge circuit 4 is located at a level of Vdc+Vth immediately before first switch element 5 is turned on (see time point (2)). However, output voltage Vo returns to a level of Vdc immediately after first switch element 5 is turned on. The change in output voltage Vo caused by turn-on of first switch element 5 is small as Vth, and output voltage Vo changes from the higher voltage to the lower voltage. Therefore, the influence of the parasitic capacitance between the second terminal and the first terminal does not generate the false firing of already turned-off second switch element 6.

The small change of V23 is generated when first switch element 5 is turned on, what is called a zero volt switching (ZVS), and the switching energy is very small during the turn-on.

The operations of first switch element 5 of upper arm 1 and second switch element 6 of lower arm 2 at time point (3) or time point (4) will be described in detail with reference to FIG. 5C.

As illustrated in FIG. 5C, the transition of Vo from the H level to the L level (see period DT from time point (3) to time point (4)) is generated by turning off first switch element 5 of upper arm 1. Second switch element 6 is turned on after period DT in which both first switch element 5 and second switch element 6 are in the off state (see time point (4)).

In the transition of Vo from the H level to the L level, control terminal voltage V13 (GL) of second switch element 6 in the off state is influenced by the parasitic capacitance between the first terminal and the second terminal of second switch element 6. However, as illustrated in FIG. 5C, the false firing of second switch element 6 is not generated because control voltage V13 (GL) of second switch element 6 is swung to the negative voltage side in the transition of Vo from the H level to the L level (see period DT from time point (3) to time point (4)).

Output voltage Vo of half bridge circuit 4 is located at a level of –Vth immediately before second switch element 6 is turned on (see time point (4)). However, output voltage Vo returns to 0 V immediately after second switch element 6 is turned on.

The change in output voltage Vo caused by turn-on of second switch element 6 is small as Vth, and output voltage Vo changes from the lower voltage to the higher voltage. Therefore, the influence of the parasitic capacitance between the second terminal and the first terminal does not generate the false firing of already turned-off first switch element 5.

The small change of V23 is generated when second switch element 6 is turned on, what is called a zero volt switching (ZVS), and the switching energy is very small during the turn-on.

As can be seen the above description, in the half bridge circuit of the first exemplary embodiment that performs the resonance inverter operation, the switching loss is eliminated during the turn-on, but the false firing is not generated. Therefore, in the half bridge circuit that performs the resonance inverter operation, it is only necessary to study the switching loss during turn-off and the switching loss during DT.

The switching loss during turn-off can be classified into two kinds.

One is caused by the parasitic output capacity of the FWD included in the half bridge circuit. However, the FWD is not connected to the switch element of the exemplary embodiment of the present disclosure. Therefore, the switching loss caused by the FWD can be decreased compared with the conventional technology.

The other is the transistor loss caused by the transistor that is of the switch element. During the turn-off of the switch element, a control terminal (corresponds to the first terminal in the switch element of the exemplary embodiment of the present disclosure) of the transistor is subjected to negative feedback operation through a Crss parasitic capacitance (corresponds to the parasitic capacitance between the first terminal and the second terminal in the switch element of the exemplary embodiment of the present disclosure) or inductance of the third terminal (source terminal). At this point, sometimes the transistor becomes the on state. As a result, load current IL is partially passed through the transistor to generate a switching loss of the transistor. This is defined as a transistor loss.

As to a transistor loss preventing method, there is a method for applying a negative bias voltage (–VB) between the first terminal and the third terminal of the switch element during the turn-off of the switch element. The on state of the transistor can be prevented by applying the negative bias voltage even if the control terminal of the transistor is subjected to the negative feedback operation through the Crss parasitic capacitance or the inductance of the source terminal.

However, the voltage between the second terminal and the third terminal increases when negative bias voltage (−VB) is provided between the first terminal and the third terminal of the switch element to prevent the transistor loss during the turn-off. Therefore, there is a problem in that the switching loss during DT increases compared with the conventional switch element (see FIGS. 2A and 2B).

A method for solving the problem will be described in detail with reference to FIGS. 5C and 5D.

As described above, the transition of Vo from the L level to the H level (see period DT from time point (1) to time point (2)) is generated by turning off second switch element 6 of lower arm 2. First switch element 5 is turned on after period DT in which both first switch element 5 and second switch element 6 are in the off state (see time point (2)). Load current IL is passed from the third terminal to the second terminal of first switch element 5 in the off state by the turn-off of second switch element 6 when the output voltage Vo reaches the H level. At this point, as described above, when negative bias voltage (−VB) is provided to voltage V13 of first switch element 5 in order to eliminate the transistor loss during turn-off, voltage V23 of first switch element 5 becomes −(Vth+VB) (see fields c-1 and c-3 in FIG. 2C). Because first switch element 5 has voltage V23 of −(Vth+VB) during DT, the switching loss during DT caused by negative bias voltage (−VB) increases.

Before time T1 from the time point second switch element 6 is subjected to the off control (see time point (1)), control signal GH2 is changed such that voltage V13 (GH−Vo) of first switch element 5 subjected to the off control becomes the substantial zero voltage. Voltage V23 of first switch element 5 becomes −Vth by the change of control signal GH2, and voltage V23 increases by VB. Therefore, the increase in switching loss during DT of first switch element 5, which is caused by providing the negative bias voltage to V13, can be prevented.

GL is set to negative bias voltage (−VB) when control signal GL2 output to the input and output terminals of second switch element 6 is changed before time T3 from the time point second switch element 6 is turned off (see time point (1)). Therefore, the transistor loss can be prevented when second switch element 6 is turned off.

On the other hand, as described above, the transition of Vo from the H level to the L level (see period DT from time point (3) to time point (4)) is generated by turning off first switch element 5 of upper arm 1. Second switch element 6 is turned on after period DT in which both first switch element 5 and second switch element 6 are in the off state (see time point (4)). Load current IL is passed from the third terminal to the second terminal of second switch element 6 in the off state by the turn-off of first switch element 5 when the output voltage Vo reaches the L level. At this point, as described above, when negative bias voltage (−VB) is provided to V13 in order to eliminate the transistor loss during turn-off, voltage V23 of second switch element 6 becomes −(Vth+VB) (see fields c-1 and c-3 in FIG. 3C). Because second switch element 6 has voltage V23 of −(Vth+VB) during DT, the switching loss during DT caused by negative bias voltage (−VB) increases.

Before time T1 from the time point first switch element 5 is subjected to the off control (see time point (3)), control signal GL2 is changed such that voltage V13 (GL) of second switch element 6 subjected to the off control becomes the substantial zero voltage. Voltage V23 of second switch element 6 becomes −Vth by the change of control signal GL2, and voltage V23 of second switch element 6 increases by VB. Therefore, the increase in switching loss during DT of second switch element 6, which is caused by providing the negative bias voltage to voltage V13 of second switch element 6, can be prevented.

GH−Vo is set to negative bias voltage (−VB) when control signal GH2 output to the input and output terminals of first switch element 5 is changed before time T3 from the time point first switch element 5 is turned off (see time point (3)). Therefore, the transistor loss can be prevented when first switch element 5 is turned off.

Thus, the transistor loss is eliminated in the switching loss during turn-off, and only the loss caused by the parasitic output capacity remains. Referring to FIG. 5E, this can bee seen from comparison of the switching loss of QH without negative bias voltage VB to the switching loss of QL without negative bias voltage VB. In FIGS. 5C and 5D, broken-line waveforms of GL2, GH2, and Vo indicate the case in which negative bias voltage VB does not exist.

The FWD is not connected to first switch element 5 and second switch element 6 of half bridge circuit 4 of the second exemplary embodiment. Therefore, the switching loss can significantly be decreased compared with a resonance inverter of the conventional half bridge circuit.

(Others)

The switch element of each exemplary embodiment of the present disclosure may be constructed with a heterojunction field effect transistor including a semiconductor layered body that is made of nitride semiconductor formed on a semiconductor substrate, a drain terminal and a source terminal that are formed on the semiconductor layered body while separated from each other, and a gate terminal that is formed between the drain terminal and the source terminal.

The switch element is constructed with the heterojunction field effect transistor, which eliminates the parasitic element. Therefore, the function of the switch element of each exemplary embodiment of the present disclosure can be exerted. The switch element is an ideal switch element having a high withstand voltage, a small on-resistance, and a few recovery current. Accordingly, the half bridge circuit in which downsizing and high efficiency are implemented by high-frequency switching operation can be constructed with the switch element.

In the first and second exemplary embodiments, the half bridge circuit is described as a minimum-unit switching circuit constituting the AC-DC converter or inverter. Accordingly, the present disclosure is not limited to the first and second exemplary embodiments, but a circuit may be constructed with a combination of some half bridge circuits each of which is used in the exemplary embodiments. Specifically, examples of the circuit include a full bridge circuit constructed with the two half bridge circuits and a three-phase inverter circuit constructed with the three half bridge circuits.

The present disclosure relates to the half bridge circuit used in the AC-DC converter or inverter, particularly the present disclosure is useful in the case that downsizing and high efficiency are implemented in the high-frequency switch.

What is claimed is:

1. A half bridge circuit comprising:
an upper arm;
a lower arm; and
a control circuit that controls the upper arm and the lower arm,
wherein
the upper arm includes a first switch element,
the lower arm includes a second switch element, the first switch element and the second switch element are a semiconductor element including a first terminal that controls a current and a second terminal and a third terminal that input and output the current, when a voltage between the first terminal and the third terminal or a voltage between the first terminal and the second terminal is greater than or equal to a threshold voltage, the current is passed from the second terminal to the third terminal or from the third terminal to the second terminal in accordance with a polarity of the voltage between the second terminal and the third terminal, when the current is passed from the third terminal to the second terminal, the voltage between the second terminal and the third terminal changes with respect to the voltage applied between the first terminal and the third terminal within a range where the voltage between the first terminal and the third terminal is less than or equal to the threshold voltage, when the second switch element is turned off, the voltage between the first terminal and the third terminal of the second switch element is switched to a substantial zero voltage or a negative bias voltage, and before the first switch element is turned off, the voltage between the first terminal and the third terminal of the second switch element is switched from the negative bias voltage to the substantial zero voltage.

2. The half bridge circuit according to claim 1, further comprising:

an output terminal that is of a connection point of the upper arm and the lower arm and that outputs an output voltage; and a load which is connected to the output terminal and in which a load current passes by application of the output voltage, wherein in the load, a frequency response of the load current is delayed with respect to the output voltage, the load has a feature that the load current passes only in one direction of the load irrespective of switching operation of the output voltage, and before the first switch element is turned on, the voltage between the first terminal and the third terminal of the second switch element is switched from the substantial zero voltage to the negative bias voltage.

3. The half bridge circuit according to claim 1, further comprising:

an output terminal that is of a connection point of the upper arm and the lower arm and that outputs an output voltage; and a load which is connected to the output terminal and in which a load current passes by application of the output voltage, wherein the load has a resonant frequency which is lower than a switching frequency of the output voltage, and has a feature that a phase of the load current is delayed with respect to the output voltage, when the first switch element is turned off, the voltage between the first terminal and the third terminal of the first switch element is switched to a substantial zero voltage or a negative bias voltage, and the voltage applied between the first terminal and the third terminal of the first switch element is switched to the negative bias voltage before the first switch element is turned off.

4. The half bridge circuit according to claim 1, wherein the first switch element is a heterojunction field effect transistor including:

a semiconductor layered body that is made of a nitride semiconductor formed on a semiconductor substrate;

a drain terminal and a source terminal that are formed on the layered body while separated from each other; and a gate terminal that is formed between the drain terminal and the source terminal.

5. A full bridge circuit constituted of two half bridge circuits according to claim 1.

6. A three-phase inverter circuit constituted of three half bridge circuits according to claim 1.

* * * * *